(12) United States Patent
Chen et al.

(10) Patent No.: US 8,766,663 B2
(45) Date of Patent: Jul. 1, 2014

(54) IMPLEMENTING LINEARLY WEIGHTED THERMAL CODED I/O DRIVER OUTPUT STAGE CALIBRATION

(75) Inventors: David J. Chen, Endwell, NY (US); William F. Lawson, Vestal, NY (US)

(73) Assignee: International Business Machines Corporation, Armonk, NY (US)

( * ) Notice: Subject to any disclaimer, the term of this patent is extended or adjusted under 35 U.S.C. 154(b) by 185 days.

(21) Appl. No.: 13/526,004

(22) Filed: Jun. 18, 2012

(65) Prior Publication Data

US 2013/0335114 A1     Dec. 19, 2013

(51) Int. Cl.
  *H03K 19/003*     (2006.01)
  *G06F 17/50*      (2006.01)
(52) U.S. Cl.
  USPC ............................ 326/30; 326/21; 716/100
(58) Field of Classification Search
  USPC .......................................................... 326/30
  See application file for complete search history.

(56) References Cited

U.S. PATENT DOCUMENTS

| | | | |
|---|---|---|---|
| 4,484,131 A | 11/1984 | Jenkinson | |
| 5,134,311 A | 7/1992 | Biber et al. | |
| 5,162,672 A | 11/1992 | McMahan et al. | |
| 5,559,441 A | 9/1996 | Desroches | |
| 5,602,494 A * | 2/1997 | Sundstrom | 326/39 |
| 6,118,310 A | 9/2000 | Esch, Jr. | |
| 6,424,175 B1 * | 7/2002 | Vangal et al. | 326/82 |
| 6,445,316 B1 | 9/2002 | Hsu et al. | |
| 6,541,996 B1 | 4/2003 | Rosenfield et al. | |
| 6,636,821 B2 * | 10/2003 | Lawson | 702/107 |
| 6,734,702 B1 * | 5/2004 | Ikeoku et al. | 326/30 |
| 6,836,170 B2 * | 12/2004 | Kitagawa et al. | 327/308 |
| 7,081,842 B2 * | 7/2006 | Cranford et al. | 341/121 |
| 7,194,559 B2 * | 3/2007 | Salmon et al. | 710/8 |
| 7,227,376 B2 | 6/2007 | Ahmad et al. | |
| 7,961,000 B1 * | 6/2011 | Gross | 326/30 |
| 8,004,308 B2 * | 8/2011 | Santurkar et al. | 326/30 |
| 8,130,056 B2 * | 3/2012 | Jansen et al. | 333/81 R |
| 8,149,014 B2 * | 4/2012 | Chen et al. | 326/30 |
| 2010/0225349 A1 | 9/2010 | Santurkar et al. | |

* cited by examiner

*Primary Examiner* — Alexander H Taningco
*Assistant Examiner* — Nelson Correa
(74) *Attorney, Agent, or Firm* — Joan Pennington (57) ABSTRACT

A method and circuit for implementing calibration of a linearly weighted, thermal coded I/O driver output stage, and a design structure on which the subject circuit resides are provided. The circuit includes a PFET calibration impedance matching function determining calibration PVTP bits for calibrating output stage PFETs of the linearly weighted, thermal coded I/O driver output stage, an NFET calibration impedance matching function determining calibration bits PVTN for calibrating output stage NFETs of the linearly weighted, thermal coded I/O driver output stage once the PFET calibration is complete and an output latch function providing the calibration PVTP and PVTN outputs for the I/O driver output stage to match an impedance of an external calibration resistor. A clock logic function generates an output latch clock and an internal reset signal completing calibration.

20 Claims, 6 Drawing Sheets

IMPLEMENTING LINEARLY WEIGHTED THERMAL CODED I/O DRIVER OUTPUT STAGE CALIBRATION

FIELD OF THE INVENTION

The present invention relates generally to the data processing field, and more particularly, relates to a method and circuit for implementing calibration of a linearly weighted, thermal coded input/output (I/O) driver output stage, and a design structure on which the subject circuit resides.

DESCRIPTION OF THE RELATED ART

Calibration of an impedance compensated driver often is needed to compensate for a wide range of Process, Voltage and Temperature (PVT) for an I/O driver output stage. One known method for calibrating an impedance compensated driver was developed for use with a binary weighted output stage. Logic to implement this known method for calibrating an impedance compensated driver requires multiple calibration cycles, for example, up to 40 calibration cycles, where a cycle is made up of 64 clock cycles, to fully calibrate the driver output stage. If using a 200 MHz clock, that amounts to 12.8 us of wait time before the driver can transmit data under calibrated impedance.

Though the known method for calibrating an impedance compensated driver for use with the binary weighted output stage can be made to work with different types of impedance compensated drivers, a need exists for a different method that is optimized for use with different types of drivers, including a linearly weighted, thermal coded I/O driver output stage.

A need exists for an efficient and effective mechanism for calibrating a linearly weighted, thermal coded I/O driver output stage. A need exists for such a mechanism that quickly determines calibration bits for P-channel field effect transistors (PFETs) and N-channel field effect transistors (NFETs) in an off chip driver to match an impedance of an external calibration resistor, and that eliminates the need for decode circuits to decode binary bits into thermal coded bits.

SUMMARY OF THE INVENTION

Principal aspects of the present invention are to provide a method and circuit for implementing calibration of a linearly weighted, thermal coded I/O driver output stage, and a design structure on which the subject circuit resides. Other important aspects of the present invention are to provide such method, circuit and design structure substantially without negative effects and that overcome many of the disadvantages of prior art arrangements.

In brief, a method and circuit for implementing calibration of a linearly weighted, thermal coded I/O driver output stage, and a design structure on which the subject circuit resides are provided. The circuit includes a P-channel field effect transistor (PFET) calibration impedance matching function determining calibration bits PVTP for calibrating output stage PFETs of the linearly weighted, thermal coded I/O driver output stage, an N-channel field effect transistor (NFET) calibration impedance matching function determining calibration bits PVTN for calibrating output stage NFETs of the linearly weighted, thermal coded I/O driver output stage once the PFET calibration is complete, and an output latch function providing the calibration PVTP and PVTN outputs for the I/O driver output stage to match an impedance of an external calibration resistor in a predefined calibration cycle.

In accordance with features of the invention, the predefined calibration cycle includes a predefined number of clock cycles, such as 64 clock cycles. The calibration PVTP and PVTN outputs include a number n of calibration bits PVTP for output stage PFETs and the number n of calibration bits PVTN for output stage NFETs and includes completing calibration within $2*(n+2)$ clock cycles.

In accordance with features of the invention, each of the PFET calibration impedance matching function and the NFET calibration impedance matching function includes a first set of latches arranged in a chain that is used to advance a logic one by one latch to a next latch per clock cycle with calibration enabled. The advancing logic one turns on sequential parallel-connected PFET pull-up transistors when calibrating PFETs, or sequential parallel-connected NFET pull-down transistors when calibrating NFETs.

In accordance with features of the invention, the PFET calibration impedance matching function includes a copy of a PFET output stage to be calibrated including a plurality of parallel-connected PFET pull-up transistors, a voltage reference and a comparator. The PFET pull-up transistors are driven off chip to the external calibration resistor. An output voltage of the PFET calibration impedance matching function at the connection of the PFETs and the external calibration resistor is compared with the reference voltage. When the output voltage rises above the reference voltage the state of the first set latches are clocked into a second set of storage latches for storing the internal calibration bits PL or PL<n:0> signals of the PFET calibration impedance matching function, and an internal NFET calibration enable is set.

In accordance with features of the invention, the NFET calibration impedance matching function includes an inverse of the PFET calibration results or inverse of the internal calibration bits PL for calibrating output stage PFETs of the linearly weighted, thermal coded I/O driver output stage, a voltage reference set by a voltage divider and a comparator. In the NFET calibration impedance matching function, the latch chain begins when the internal NFET calibration enable is set or becomes a logic one and enables increasing numbers of NFETs with each clock cycle until the negative side of the comparator is lower than the reference voltage. Once the negative side is lower than the voltage reference, the comparator output goes high and clocks a second set of storage latches for storing the internal calibration bits NL or NL<n:0> signals, and an internal calibration complete signal is set.

In accordance with features of the invention, the internal calibration complete signal is applied to a clock logic function for generating a latch clock signal applied to the output latch function to capture the state of the internal calibration bits PL or PL<n:0> and the internal calibration bits NL or NL<n:0> signals providing calibration PVTP and PVTN outputs.

In accordance with features of the invention, the clock logic function uses the internal calibration complete signal and an external reset signal to create the internal reset signal that is applied to the PFET and NFET calibration impedance matching functions, completing a calibration cycle.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of the invention, a method and circuit for implementing calibration of a linearly weighted, thermal coded I/O driver output stage, and a design structure on which the subject circuit resides are provided.

Figure 1:
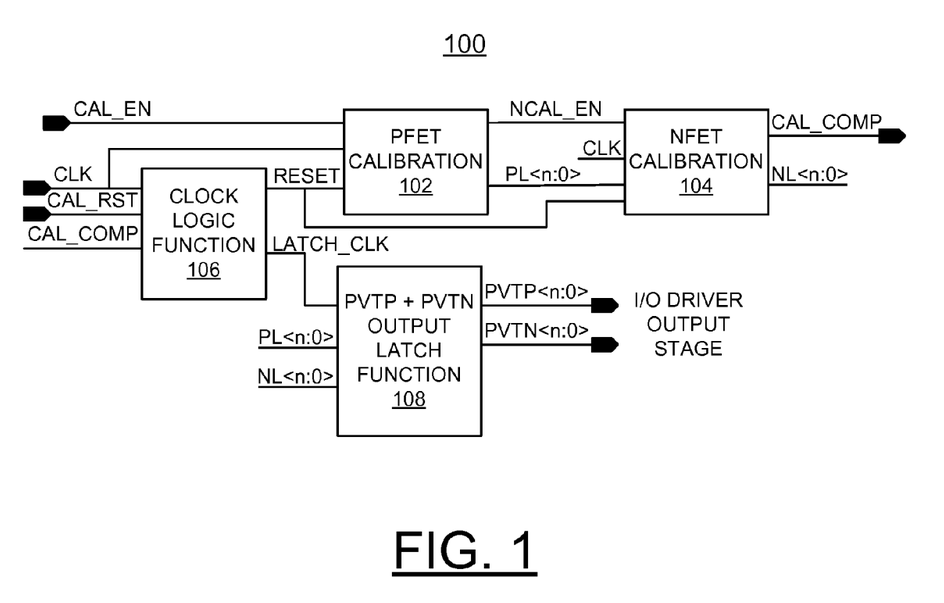
FIG. 1 provides a schematic and block diagram representation illustrating an example circuit for implementing calibration of a linearly weighted, thermal coded I/O driver output stage in accordance with a preferred embodiment.

Having reference now to the drawings, in FIG. 1, there is shown an example circuit for implementing calibration of a linearly weighted, thermal coded I/O driver output stage generally designated by the reference character 100 in accordance with a preferred embodiment. Circuit 100 provides improvement over prior art circuits by significant reducing wait time before the I/O driver output stage can transmit data under calibrated impedance.

Figure 2:
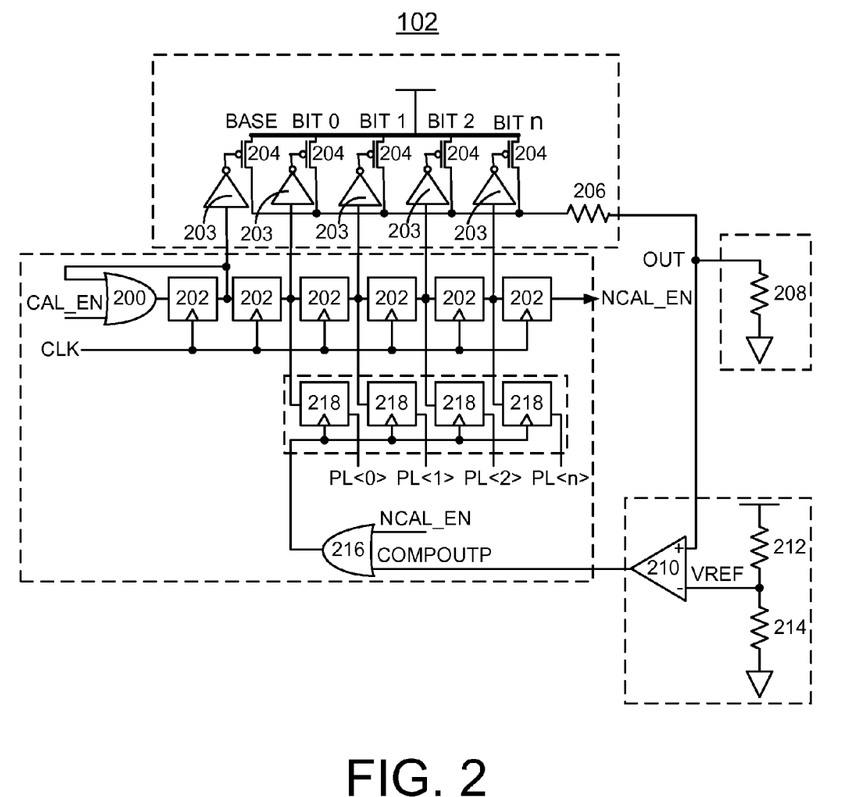
FIG. 2 is a schematic diagram representation illustrating an example PFET calibration impedance matching function determining calibration bits PVTP of the circuit of FIG. 1 in accordance with a preferred embodiment.
Figure 3:
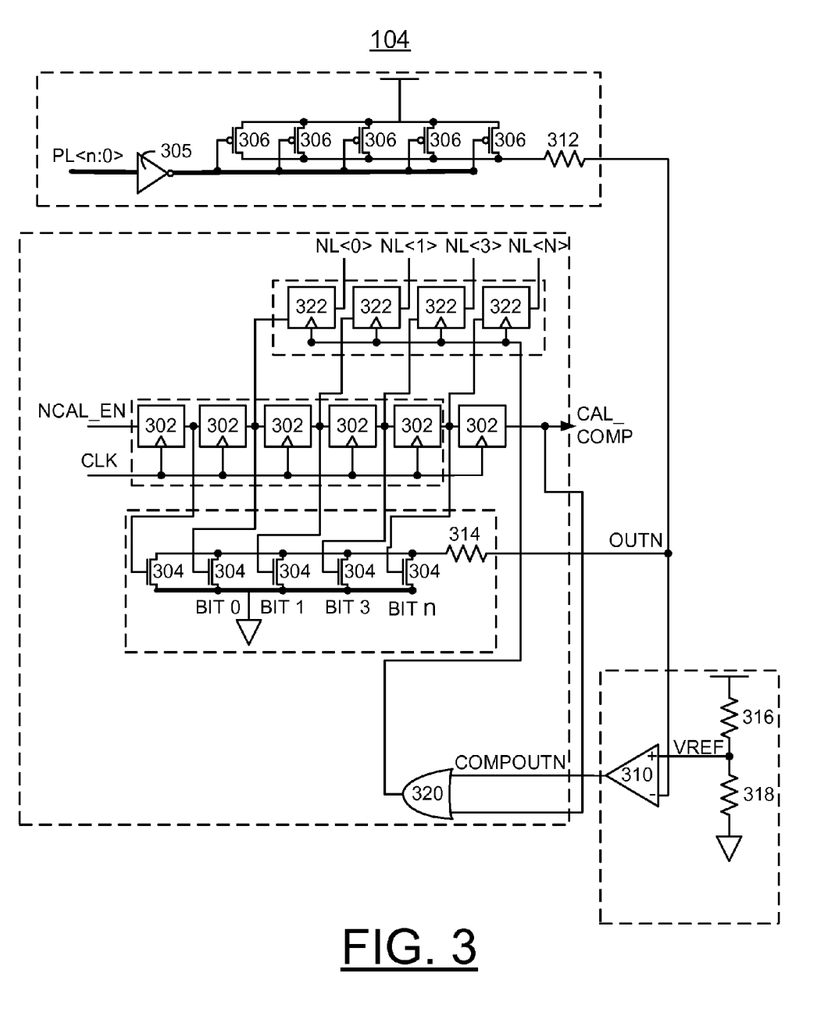
FIG. 3 is a schematic diagram representation illustrating an example NFET calibration impedance matching function determining calibration bits PVTN of the circuit of FIG. 1 in accordance with a preferred embodiment.
Figure 4:
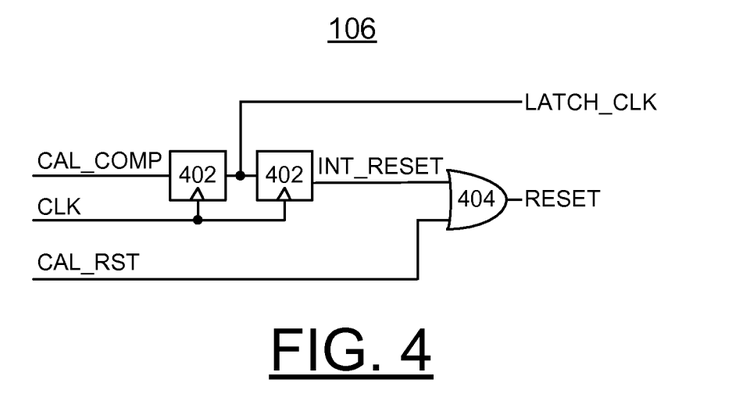
FIG. 4 is a schematic diagram representation illustrating an example clock logic function generating an output latch clock applied to an output latch function and generating an internal reset signal applied to a PFET calibration impedance matching function and an NFET calibration impedance matching function the circuit of FIG. 1 in accordance with a preferred embodiment.
Figure 5:
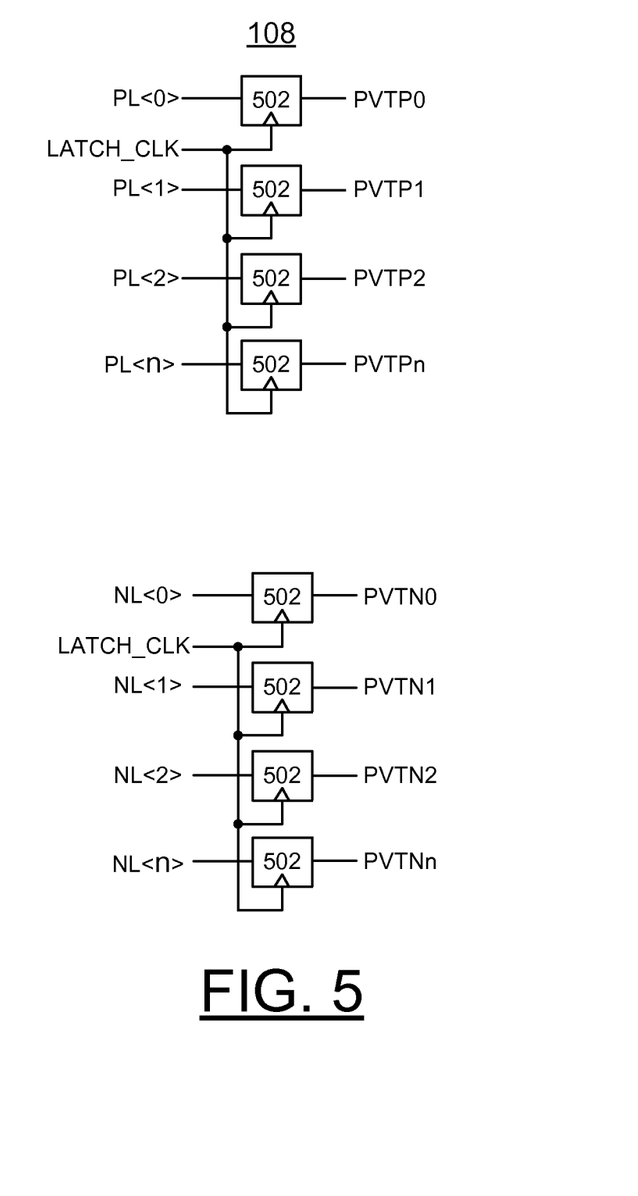
FIG. 5 is a schematic diagram representation illustrating an example output latch function of the circuit of FIG. 1 providing calibration PVTP and PVTN outputs to an I/O driver output stage to match an impedance of an external calibration resistor in accordance with a preferred embodiment.

Circuit 100 includes a PFET calibration impedance matching function 102, illustrated and described with respect FIG. 2, used for determining external calibration bits PVTP or PVTP<n:0> for output stage PFETs, an NFET calibration impedance matching function 104, illustrated and described with respect FIG. 3, used for determining external calibration bits PVTN or PVTN<n:0> for the output stage NFETs once the PFET calibration is complete, and an output latch function 108, illustrated and described with respect FIG. 5, once the NFET calibration is complete, providing the PVTP and PVTN outputs to the I/O driver output stage to match an impedance of an external calibration resistor. The circuit includes a clock logic function 106 generating an output latch clock applied to the output latch function 108 and generating an internal reset signal RESET applied to the PFET calibration impedance matching function 102 and the NFET calibration impedance matching function 104 completing calibration. The clock logic function 106 is illustrated and described with respect FIG. 4.

Circuit 100 receives external inputs including enable CAL_EN, clock CLK, and reset CAL_RST signals and provides external calibration outputs PVT settings PVTP<n:0> and PVTN<n:0> of the output latch function 108. Circuit 100 provides a calibration complete signal CAL_COMP by the NFET calibration impedance matching function 104. Throughout the entire calibration sequence the internal calibration bits, PL<n:0> and NL<n:0> or the PL and NL bits are changing as the logic 1 propagates through the respective latch chain of PFET calibration impedance matching function 102 and NFET calibration impedance matching function 104. The external bits, PVTP<n:0> and PVTN<n:0> or the PVTP and PVTN bits are latched by the output latch function 108 and output to the I/O after the calibration is complete.

The calibration complete signal CAL_COMP and the external input signals clock CLK, and reset CAL_RST are applied to the clock logic function 106. Input signals clock CLK and enable CAL_EN are applied to the PFET calibration impedance matching function 102. Input clock CLK and an internal enable NCAL_EN NFET generated by the PFET calibration impedance matching function 102 are applied to the calibration impedance matching function 104 The clock logic function 106 generates the output latch clock LATCH_CLK applied to the output latch function 108 and generates an internal reset signal RESET applied to the respective latch chain of the PFET calibration impedance matching function 102 and the NFET calibration impedance matching function 104 for completing calibration.

In operation of circuit 100, the PFETs are calibrated first. Once PFET calibration is complete, the internal NFET calibration enable signal NCAL_EN is set. When the NFET calibration is complete, a calibration complete signal CAL_COMP is set and then the output latch function 108 which is a separate logic block, latches and outputs the PVTP and PVTN settings to the linearly weighted, thermal coded I/O driver output stage. The internal reset signal RESET is applied to the PFET calibration impedance matching function 102 and the NFET calibration impedance matching function 104 completing calibration.

Referring now to FIG. 2, there is shown an example PFET calibration impedance matching function 102 used for determining external calibration bits PVTP of the circuit 100 in accordance with a preferred embodiment. The PFET calibration impedance matching function 102 includes an OR gate 200 receiving the external enable signal CAL_EN, and is coupled to a first set of latches 202, such as reset latches 202 arranged in a chain, each latch 202 receiving the external clock signal CLK. An output of the first latch 202 is applied to the OR gate 200, and is coupled by an inverter 203 to a base of a first PFET 204 of a plurality of parallel-connected PFET pull-up transistors 204. A respective latch output of the first set of latches 202 is coupled by an inverter 203 to a gate input of each of the parallel-connected PFET pull-up transistors 204. The set of latches 202 is used to advance a logic one by one latch to a next latch per clock cycle with calibration enabled by the external enable signal CAL_EN. The advancing logic one is inverted and turns on sequential parallel-connected PFET pull-up transistors 204 when calibrating PFETs.

The plurality of parallel-connected PFET pull-up transistors 204, which is a copy of a PFET output stage of the I/O driver output stage to be calibrated, is connected by a resistor 206 in the PFET calibration impedance matching function 102 to an external calibration resistor 208. The voltage output of the PFET pull-up transistors 204 are driven off chip to the external calibration resistor 208. The PFET calibration impedance matching function 102 includes a comparator 210, a reference voltage VREF and the plurality of parallel-connected PFET pull-up transistors 204.

An output voltage of the PFET calibration impedance matching function 102 at the connection of the PFETs 204 via resistor 206 to the external calibration resistor 208 at node OUT is compared with the reference voltage VREF by the comparator 210. The PFETs 204 are connected in series to the external calibration resistor 208, and as more PFETs 204 are enabled, the voltage on the positive side of the comparator will rise. The reference voltage VREF applied to the negative side of the comparator 210 is determined by a resistor divider formed by a pair of series connected resistors 212, 214 connected between a voltage supply rail and ground potential. The output COMPOUTP of the comparator 210 and the internal NFET calibration enable signal NCAL_EN are applied to an OR gate 216. Once the output voltage at node OUT on the positive side of the comparator 210 rises above the reference voltage VREF applied to the negative side of the comparator 210, the output COMPOUTP of the comparator switches to a logic one.

When the output voltage OUT rises above the reference voltage VREF, the state of the first set of latches 204, which caused the comparator 210 to switch, are clocked into a second set of storage latches 218 by the output of OR gate 216 for storing the internal calibration bits PL or PL<n:0> signals of the PFET calibration impedance matching function 102, and the internal NFET calibration enable NCAL_EN is set at the output of the latch chain of the first set of latches 202. The storage latches 218 that capture the calibrated state are rising edge triggered latches. If latches that read the data input as long as the clock signal is high were used for the storage latches 218, these latches would continue to read the data input while the logic 1 propagates through the rest of the latches 202 in the latch chain. In that case, the capture latches 218 will eventually read all 1s. Using rising edge triggered latches for the storage latches 218 prevent this from happening. The rising edge triggered capture latches 218 will read the data once the output of the OR gates 216 goes high then ignore the data input until the calibration circuits are reset The internal NFET calibration enable NCAL_EN is used to signal the completion of PFET calibration and initiate the NFET calibration.

It should be understood that if set/reset style latches are used for latches 202, the output of the OR gate 216 can be used to set the remain latches 202 in the latch chain so that the internal NFET calibration enable is set and the PFET calibration can be considered complete earlier than having to wait for the logical one to propagate through the remaining latches 202 in the chain. It is possible for the output of the OR gate 216 to remain low until all of the PFETs 204 are enabled. In certain process conditions, the output of the comparator 210 may remain low even with all of the PFETs 204 enabled. In this case, the result of the calibration is to enable all of the corresponding PFETs in the output stage, and it is the internal NFET calibration enable NCAL_EN that will cause the output of the OR gate 216 to switch to a logic one and clock the storage latches 218 for storing the internal calibration bits PL or PL<n:0> signals of the PFET calibration impedance matching function 102.

In accordance with features of the invention, once the PFET calibration is complete, the NFETs are calibrated.

Referring now to FIG. 3, there is shown an example NFET calibration impedance matching function 104 determining calibration bits PVTN of the circuit of FIG. 1 in accordance with a preferred embodiment. The NFET calibration impedance matching function 104 includes a first set of latches 302, such as reset latches 302 arranged in a chain, each latch 302 receiving the external clock signal CLK and a first chain latch 302 receiving the internal NFET calibration enable NCAL_EN. The NFET calibration impedance matching function 104 includes a plurality of parallel-connected NFET pull-down transistors 304, which is a copy of an NFET output stage of the I/O driver output stage to be calibrated.

Rather than using an external calibration resistor, such as the external calibration resistor 208 used for PFET calibration, the NFETs 304 are calibrated with respect to the previously calibrated PFET stage. The NFET calibration impedance matching function 104 includes a plurality of parallel-connected PFETs 306 receiving respective gate inputs via an inverter 305 that receives and inverts the PL<n:0> of the PFET calibration results stored to set the PFET impedance. The NFET calibration impedance matching function 104 includes a comparator 310, and a reference voltage VREF.

In the NFET calibration impedance matching function 104, similarly the set of latches 302 is used to advance a logic one by one latch to a next latch per clock cycle with calibration enabled by the calibration enable signal NCAL_EN. The advancing logic one of the first latch chain turns on additional parallel-connected NFET pull-down transistors 304 when calibrating NFETs.

An output voltage at node OUTN of the PFETs 306 via a resistor 312 and an output voltage of the NFETs 304 via a resistor 314 is connected to a negative side of the comparator 310 and is compared with the reference voltage VREF by the comparator 310. The reference voltage VREF applied to the positive side of the comparator 310 is determined by a resistor divider formed by a pair of series connected resistors 316, 318 connected between a voltage supply rail and ground potential. An output COMPOUTN of the comparator 310 and the internal calibration complete signal CAL_COMP are applied to an OR gate 320.

Once output voltage OUTN on the negative side of the comparator 310 is lower than the voltage reference VREF, the comparator output goes high and the state of the first set of latches 302 which caused the comparator 310 to switch are clocked into a second set of storage latches 322 by the output of OR gate 320 for storing the internal calibration bits NL or NL<n:0> signals of the NFET calibration impedance matching function 104. The storage latches 322 that capture the calibration state are rising edge triggered latches. The rising edge triggered capture latches 322 will read the data once the output of the OR gates 320 goes high then ignore the data input until the calibration circuits are reset In the NFET calibration, the output COMPOUTN of the comparator 310 is ORed with the calibration complete signal CAL_COMP to cover cases where all of the NFETs 304 must be enabled for proper calibration. Also, as with the PFET calibration, the output of the comparator 310 can be used to set the remaining latches 302 in the latch chain to signal that the calibration is complete, i.e., with the calibration complete signal CAL_COMP becomes a logic one sooner than having to wait for the clock signal CLK to propagate the logic one through the latch chain.

Referring now to FIG. 4, there is shown an example clock logic function 106 generating an output latch clock LATCH_CLK applied to the output latch function 108 and generating an internal reset signal RESET applied to the PFET calibration impedance matching function 102 and the NFET calibration impedance matching function 104 of circuit 100 in accordance with a preferred embodiment. The clock logic function 106 includes a pair of latches 402 and an OR gate 404. The internal calibration complete signal CAL_COMP is applied to the first latch 402 and the clock signal CLK is applied to the pair of latches 402 of the clock logic function 106 for generating the latch clock signal LATCH_CLK at the output of the first latch 402. The latch clock signal LATCH_CLK is applied to the output latch function 108 to capture the state of the internal calibration bits PL or PL<n:0> from the PFET calibration impedance matching function 102 and to capture the state of the calibration bits NL or NL<n:0> signals from the NFET calibration impedance matching function 104 for calibrating the I/O driver output stage to match the impedance of the external calibration resistor 208.

The clock logic function 106 uses the internal calibration complete signal CAL_COMP, which is propagated through the second latch 402 to generate an internal reset signal INT_RESET. The internal reset signal INT_RESET and the external reset CAL_RST are ORed by OR gate 404 to create the internal reset signal RESET that is sent to the latches 202, 218 and the latches 302, 322 of the PFET and NFET calibration impedance matching functions 102, 104, completing a calibration cycle. Then if external enable signal CAL_EN is still high, the calibration sequence begins again.

Referring now to FIG. 5, there is shown an example output latch function 108 of the circuit 100 providing external calibration bits PVTP or PVTP<n:0> and PVTN or PVTN<n:0> outputs to an I/O driver output stage in accordance with a preferred embodiment. The output latch function 108 includes a plurality of latches 502 each receiving the clock signal LATCH_CLK, and a respective one of the internal calibration bits PL or PL<n:0> and the internal calibration bits NL or NL<n:0> signals, and providing the PVTP or PVTP<n:0> and PVTN or PVTN<n:0> outputs.

In summary, circuit 100 quickly determines external calibration bits PVTP or PVTP<n:0> signals for P-channel field effect transistors (PFETs) and external calibration bits PVTN or PVTN <n:0> signals for N-channel field effect transistors (NFETs) to match an impedance of an external calibration resistor, significantly reducing wait time before the I/O driver output stage can transmit data under calibrated impedance, and eliminating the need for decode circuits to decode binary bits into thermal coded bits. Considering the flow of the logic one through the latch chain of latches 202 of the PFET calibration impedance matching function 102, it can be seen that it can take as many as (n+2) clock cycles to calibrate the PFETs. In the first clock cycle, the latch chain enables the base bit of the first PFET 204. If all of the PFETs 204 must be enabled, n clock cycles are required to propagate the logic one through the latches 202 for each bit. FIG. 1 shows one extra latch 202 at the end of the chain that outputs the internal NFET calibration enable NCAL_EN signal. The calculation for counting the number of cycles to calibrate the NFETs is the same as above for calibrating the PFETs. This provides a total calibration time of approximately 2*(n+2) clock cycles. A few extra clock cycles are required after the NFETs are calibrated to propagate the PVT settings to the I/O and reset the latches in the latch chains in preparation for the calibration sequence to restart. This is a significant reduction in the time required to calibrate when compared to the conventional logic currently used to calibrate a binary weighted output stage.

Figure 6:
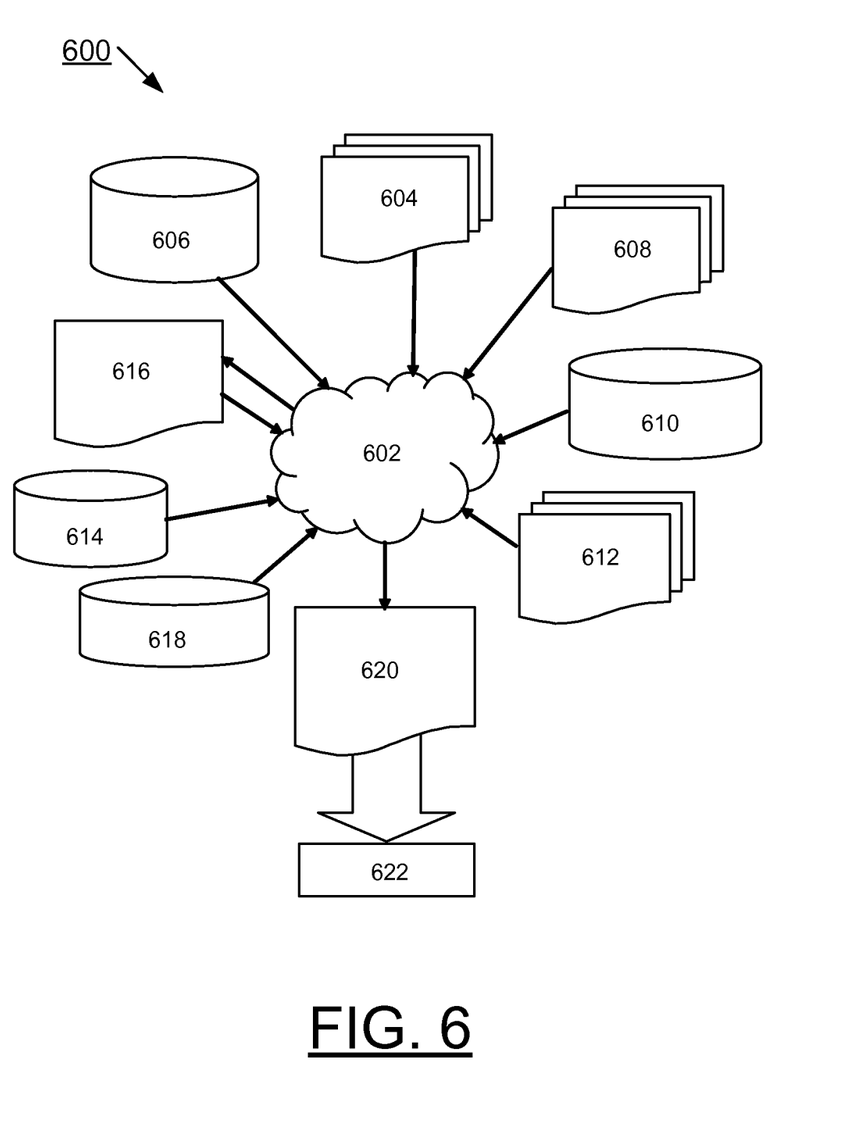
FIG. 6 is a flow diagram of a design process used in semiconductor design, manufacturing, and/or test.

FIG. 6 shows a block diagram of an example design flow 600. Design flow 600 may vary depending on the type of IC being designed. For example, a design flow 600 for building an application specific IC (ASIC) may differ from a design flow 600 for designing a standard component. Design structure 602 is preferably an input to a design process 604 and may come from an IP provider, a core developer, or other design company or may be generated by the operator of the design flow, or from other sources. Design structure 602 comprises circuit 100 in the form of schematics or HDL, a hardware-description language, for example, Verilog, VHDL, C, and the like. Design structure 602 may be contained on one or more machine readable medium. For example, design structure 602 may be a text file or a graphical representation of circuit 100. Design process 604 preferably synthesizes, or translates, circuit 300 into a netlist 606, where netlist 606 is, for example, a list of wires, transistors, logic gates, control circuits, I/O, models, etc. that describes the connections to other elements and circuits in an integrated circuit design and recorded on at least one of machine readable medium. This may be an iterative process in which netlist 606 is resynthesized one or more times depending on design specifications and parameters for the circuit.

Design process 604 may include using a variety of inputs; for example, inputs from library elements 608 which may house a set of commonly used elements, circuits, and devices, including models, layouts, and symbolic representations, for a given manufacturing technology, such as different technology nodes, 22 nm, 32 nm, 45 nm, 90 nm, and the like, design specifications 610, characterization data 612, verification data 616, design rules 616, and test data files 618, which may include test patterns and other testing information. Design process 604 may further include, for example, standard circuit design processes such as timing analysis, verification, design rule checking, place and route operations, and the like. One of ordinary skill in the art of integrated circuit design can appreciate the extent of possible electronic design automation tools and applications used in design process 604 without deviating from the scope and spirit of the invention. The design structure of the invention is not limited to any specific design flow.

Design process 604 preferably translates an embodiment of the invention as shown in FIGS. 1-5 along with any additional integrated circuit design or data (if applicable), into a second design structure 620. Design structure 620 resides on a storage medium in a data format used for the exchange of layout data of integrated circuits, for example, information stored in a GDSII (GDS2), GL1, OASIS, or any other suitable format for storing such design structures. Design structure 620 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 1-5. Design structure 620 may then proceed to a stage 622 where, for example, design structure 620 proceeds to tape-out, is released to manufacturing, is released to a mask house, is sent to another design house, is sent back to the customer, and the like.

While the present invention has been described with reference to the details of the embodiments of the invention shown in the drawing, these details are not intended to limit the scope of the invention as claimed in the appended claims.

What is claimed is:

1. A circuit for implementing calibration of a linearly weighted, thermal coded I/O driver output stage, said circuit comprising:

a P-channel field effect transistor (PFET) calibration impedance matching function determining calibration bits PVTP for output stage PFETs, an N-channel field effect transistor (NFET) calibration impedance matching function coupled to said PFET calibration impedance matching function, determining calibration bits PVTN for output stage NFETs, responsive to PFET calibration completed, and an output latch function coupled to said PFET calibration impedance matching function and said NFET calibration impedance matching function, providing PVTP and PVTN calibration outputs, responsive to NFET calibration completed, to the linearly weighted, thermal coded I/O driver output stage within a single predefined calibration cycle.

2. The circuit as recited in claim 1 wherein said predefined calibration cycle includes a predefined number of clock cycles and wherein said PFET calibration impedance matching function provides a number n calibration bits PVTP for output stage PFETs and said NFET calibration impedance matching function provides said number n calibration bits PVTN for output stage NFETs and wherein calibration is completed within approximately 2*(n+2) clock cycles.

3. The circuit as recited in claim 1 wherein said each of said PFET calibration impedance matching function and said NFET calibration impedance matching function includes a first set of latches arranged in a chain and including advancing logic used to advance a logic one by one latch to a next latch per clock cycle with calibration enabled.

4. The circuit as recited in claim 3 wherein said PFET calibration impedance matching function includes a copy of a PFET output stage to be calibrated including a plurality of parallel-connected PFET pull-up transistors; and wherein said NFET calibration impedance matching function includes a copy of an NFET output stage to be calibrated including a plurality of parallel-connected NFET pull-down transistors, and a respective latch output providing a gate input to each of said parallel-connected PFET pull-up transistors and each of said parallel-connected NFET pull-down transistors.

5. The circuit as recited in claim 4 wherein said advancing logic one turns on sequential parallel-connected PFET pull-up transistors when calibrating PFETs, or sequential parallel-connected NFET pull-down transistors when calibrating NFETs.

6. The circuit as recited in claim 3 wherein said PFET calibration impedance matching function includes a voltage reference and a comparator, and a plurality of parallel-connected PFET pull-up transistors coupled to an external calibration resistor.

7. The circuit as recited in claim 6 wherein said parallel-connected PFET pull-up transistors are driven off chip to said external calibration resistor, and an output voltage at a connection to said external calibration resistor is compared with said reference voltage.

8. The circuit as recited in claim 7 wherein said PFET calibration impedance matching function includes a second set of storage latches for storing the calibration bits PVTP of the PFET calibration impedance matching function, and an output of said comparator switching, responsive to said compared output voltage and said reference voltage and a state of said first set of latches are clocked into said second set of storage latches and an internal NFET calibration enable signal is set.

9. The circuit as recited in claim 3 wherein said NFET calibration impedance matching function includes a plurality of parallel-connected NFET pull-down transistors, a voltage reference and a comparator; and an output voltage of said parallel-connected NFET pull-down transistors being calibrated with respect to said calibration bits PVTP of said PFET calibration impedance matching function.

10. The circuit as recited in claim 9 wherein said NFET calibration impedance matching function includes a second set of storage latches for storing the calibration bits PVTN of the NFET calibration impedance matching function, and an output of said comparator switching, responsive to said compared output voltage and said reference voltage and a state of said first set latches are clocked into said second set of storage latches and an calibration complete signal is set.

11. The circuit as recited in claim 1 wherein said output latch function includes a respective latch for storing, responsive to an applied output latch clock each of said calibration bits PVTP from said PFET calibration impedance matching function and each of said calibration bits PVTN from said NFET calibration impedance matching function.

12. The circuit as recited in claim 1 includes a clock logic function receives an internal calibration complete signal for generating a latch clock signal applied to said output latch function and said clock logic function uses said internal calibration complete signal and an external reset signal to create an internal reset signal applied to said PFET and NFET calibration impedance matching functions for completing said calibration cycle.

13. A design structure embodied in a non-transitory machine readable medium used in a design process, the design structure comprising:

a circuit tangibly embodied in the non-transitory machine readable medium used in the design process, said circuit for implementing calibration of a linearly weighted, thermal coded I/O driver output stage, said circuit comprising:

a P-channel field effect transistor (PFET) calibration impedance matching function determining calibration bits PVTP for output stage PFETs, an N-channel field effect transistor (NFET) calibration impedance matching function coupled to said PFET calibration impedance matching function, determining calibration bits PVTN for output stage NFETs, responsive to PFET calibration completed, and an output latch function coupled to said PFET calibration impedance matching function and said NFET calibration impedance matching function, providing PVTP and PVTN calibration outputs, responsive to NFET calibration completed, to the linearly weighted, thermal coded I/O driver output stage within a single predefined calibration cycle, wherein the design structure, when read and used in the manufacture of a semiconductor chip produces a chip comprising said circuit.

14. The design structure of claim 13, wherein the design structure comprises a netlist, which describes said circuit.

15. The design structure of claim 13, wherein the design structure resides on storage medium as a data format used for the exchange of layout data of integrated circuits.

16. The design structure of claim 13, wherein the design structure includes at least one of test data files, characterization data, verification data, or design specifications.

17. The design structure of claim 13, wherein said PFET calibration impedance matching function provides a number n of calibration bits PVTP for output stage PFETs and said NFET calibration impedance matching function provides said number n of calibration bits PVTN for output stage NFETs and wherein calibration is completed within approximately 2*(n+2) clock cycles.

18. The design structure of claim 13, includes a clock logic function generating an output latch clock applied to said output latch function to capture said PVTP and PVTN calibration outputs and said clock logic function generating an internal reset signal applied to said PFET calibration impedance matching function and said NFET calibration impedance matching function completing calibration 19. A method for implementing calibration of a linearly weighted, thermal coded I/O driver output stage, said method comprising:
   providing a PFET calibration impedance matching function, determining calibration bits PVTP for output stage PFETs,
   providing an NFET calibration impedance matching function, determining calibration bits PVTN for output stage NFETs, responsive to PFET calibration completed,
   providing an output latch function, providing PVTP and PVTN calibration outputs responsive to NFET calibration completed, to the linearly weighted, thermal coded I/O driver output stage within a single predefined calibration cycle.

20. The method as recited in claim 19 wherein said output latch function, providing PVTP and PVTN calibration outputs responsive to NFET calibration completed includes said output latch function, providing a number n of calibration bits PVTP for output stage PFETs and said number n of calibration bits PVTN for output stage NFETs and includes completing calibration within approximately 2*(n+2) clock cycles.

* * * * *